(12) United States Patent
Watanabe et al.

(10) Patent No.: US 6,191,978 B1
(45) Date of Patent: Feb. 20, 2001

(54) NON-VOLATILE SEMICONDUCTOR MEMORY DEVICE

(75) Inventors: Kazuo Watanabe; Masaki Uekubo, both of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/553,880

(22) Filed: Apr. 20, 2000

(30) Foreign Application Priority Data

Apr. 26, 1999 (JP) .................................. 11-118853

(51) Int. Cl.$^7$ .................................................. G11C 11/06
(52) U.S. Cl. ................................ 365/185.21; 365/185.25
(58) Field of Search ...................... 365/185.21, 185.25, 365/185.33

(56) References Cited

U.S. PATENT DOCUMENTS 5,511,022 * 4/1996 Yim et al. ...................... 365/185.25

FOREIGN PATENT DOCUMENTS 2-285593  11/1990 (JP) .

* cited by examiner

Primary Examiner—Trong Phan
(74) Attorney, Agent, or Firm—Scully, Scott, Murphy & Presser

(57) ABSTRACT

A non-volatile semiconductor memory device is provided which is capable of shortening time required for determining a reading voltage in its reading circuit and of improving a data reading speed. The non-volatile semiconductor memory device has a feedback-type bias circuit for letting currents to flow, in response to a first timing signal occurring when an address of a memory cell is selected from a load circuit to the memory cell to be connected to a bit line through a bit line decoder according to selection of the address and to be connected through a word line, causing a predetermined bias current to be supplied to the bit line and for letting a current to flow in accordance with an ON-state or OFF-state of the memory cell, causing a reading voltage to be produced at a connection point with the load circuit and a pre-charging circuit for letting currents to flow through the bit line in response to a second timing signal occurring in an early stage when the first timing signal is active and for interrupting currents flowing through the bit line in a last stage when the second timing signal is active.

15 Claims, 12 Drawing Sheets

NON-VOLATILE SEMICONDUCTOR MEMORY DEVICE

BACKGROUND OF THE INVENTION

1. Field of the Invention

The present invention relates to a non-volatile semiconductor memory device capable of speeding up a determination of a reading voltage, thereby making operations of reading stored information faster.

2. Description of the Related Art

In semiconductor memory devices, acceleration of access time required for reading and writing stored information is a significant challenge in order to improve their performance. It is needless to say that a same goes for non-volatile semiconductor memory devices such as a flash memory or a like.

In recent years, there is a tendency that a structure of the non-volatile semiconductor device is scaled down to increase a storage capacity, which presents a problem of drain disturbance.

For example, in a case of the flash memory, since application of a high voltage to a drain of a scaled-down floating gate-type MOSFET (Metal Oxide Semiconductor Field Effect Transistor) constituting a memory cell becomes difficult, it is necessary to discriminate the memory cell (hereinafter may be also referred to as an "OFF-cell") in a state where an electric charge has been injected into a floating gate by using a low voltage of, for example, about 0.5 V as a bias voltage to be applied to the memory cell causing a current not to flow from a memory cell (hereinafter may be also referred to as an "ON-cell") in a state where the electric charge has been drawn from the floating gate, allowing the current to flow. It is, therefore, required that a small difference in voltages for reading stored information from the memory cell be reliably detected and time required for determination of an outputting state be shortened as much as possible in order to enable a high speed reading.

Circuit configurations and one example of operations of a conventional non-volatile semiconductor memory device will be hereinafter described.

FIG. 8 is a schematic circuit diagram showing an example of configurations of a reading circuit in the conventional non-volatile semiconductor memory device. FIG. 9 is a graph for explaining operations of a feedback-type bias circuit. FIG. 10 is a schematic block diagram of a reading timing generating circuit used for the conventional non-volatile semiconductor memory device. FIG. 11 is a timing chart showing reading operations in the conventional non-volatile semiconductor memory device. FIGS. 12A, 12B are diagrams explaining determination of an outputting state for reading in the conventional non-volatile semiconductor memory device.

As shown in FIG. 8, the reading circuit in the conventional non-volatile semiconductor memory device is chiefly composed of a memory cell $M_{mn}$ shown as a representative one selected from a memory cell array (not shown) by a bit line $BL_m$ and a word line $WL_n$, a bit line decoder $BDE_m$ shown as a representative one used to select the bit line $BL_m$, a feedback-type bias circuit 1, a load circuit 2, a pre-charging circuit 3, a sense circuit (SA) 4 and a latch circuit 5.

Also, as depicted in FIG. 8, the feedback-type bias circuit 1 has N-channel transistors 11, 12, 13 and 14 and P-channel transistors 15 and 16. A drain of the N-channel transistor 11 is connected to the load circuit 2 and a connecting point between the N-channel transistor and the load circuit 2 is hereinafter called "node C". A source of the N-channel transistor 11 is connected to the bit line decoder $BDE_m$ and a connecting point between them is hereafter called "node B". A gate of the N-channel 11 is connected to a drain of the N-channel transistor 14 and a connecting point between them is hereafter called "node A". A source of the P-channel transistor 15 is connected to a power source $V_{DD}$, its drain is connected to a node A and its gate is connected to a line of a sense amplifier activating signal SAE. A source of the P-channel transistor 16 is connected to the power source $V_{DD}$, its drain is connected to a drain of the N-channel transistor 12 and its gate is connected to a line of the sense amplifier activating signal SAE. A gate of the N-channel transistor 12 is connected to its drain and its source is connected to the node A. A drain of the N-channel transistor 13 is connected to the node A, its source is connected to a ground and its gate is connected to a line of the sense amplifier activating signal SAE. A drain of the N-channel transistor 14 is connected to the node A, its source is connected to the ground and its gate is connected to the node B.

The load circuit 2 has a P-channel transistor 21 and an N-channel transistor 22. A source of the P-channel transistor 21 is connected to the power source $V_{DD}$, its drain is connected to a drain of the N-channel transistor 22 and its gate is connected to a line of the sense amplifier activating signal SAE. A gate of the N-channel transistor 22 is connected to its drain and its source is connected to the node C. The pre-charging circuit 3 has a P-channel transistor 31 and an N-channel transistor 32. A source of the P-channel transistor 31 is connected to the power source $V_{DD}$, its drain is connected to a drain of the N-channel transistor 32 and its gate is connected to a line of a bit line pre-charging signal ATDP. A source of the N-channel transistor 32 is connected to the node B and its gate is connected to the node A.

The sense circuit 4 is composed of a comparison circuit used to compare a reference voltage $V_{REF}$ from a reference circuit (not shown) with an output voltage $V_A$ at the node C connected to the drain of the N-channel transistor 11 of the feedback-type bias circuit 1 and to produce a signal showing a result of comparison. The latch circuit 5 is composed of a circuit used to latch an output of the sense circuit 4 in response to a sense amplifier output latching signal LAT.

The feedback-type bias circuit 1 has a function to supply a predetermined bias voltage $V_B$ to the memory cell $M_{mn}$. The load circuit 2 functions as a load by acting as a source of a constant current provided by the power source $V_{DD}$ to the feedback-type bias circuit 1. The pre-charging circuit 3 is used to supply a pre-charging current to the bit line $BL_m$ when the bit line $BL_m$ is selected. The sense circuit 4 is adapted to judge whether the memory cell $M_{mn}$ is in the ON-cell state or in the OFF-cell state by comparing the reading output voltage $V_A$ from the feedback-type bias circuit 1 with the reference voltage $V_{REF}$ from the reference circuit (not shown). The latch circuit 5 is adapted to latch a signal showing a judging result from the sense circuit 4 and to generate output data. In the feedback-type bias circuit 1, while reading is not performed, since the sense amplifier activating signal SAE is high and the P-channel transistors 15 and 16 are turned OFF and the N-channel transistor 13 is turned ON, a voltage $V_F$ at the node A is almost 0 (zero) volts and, since the N-channel transistor 11 is in an OFF state, the voltage $V_B$ of the feedback-type bias circuit is 0 (zero) volts. On the other hand, while the reading is being performed, since the sense amplifier activating signal SAE is low, the P-channel transistors 15 and 16 are turned ON and the N-channel transistor 13 is turned OFF and, since a current flowing from the power source $V_{DD}$ through a switch composed of the P-channel transistor 15 and a current flowing from the power source $V_{DD}$ through a switch composed of the P-channel transistor 16 and through a constant current source load composed of the N-channel transistor 12 flows into the N-channel transistor 14, the voltage $V_F$ generated at the node A is supplied to the gate of the N-channel transistor 11. Though this causes a current to flow through the N-channel transistor 11 and the predetermined bias voltage $V_B$ to be generated at the node B, since a line for the predetermined bias voltage $V_B$ is connected to the gate of the N-channel transistor 14, a current flowing through the N-channel transistor changes depending upon the predetermined bias voltage $V_B$ and therefore the voltage $V_F$ at the node A to be supplied to the gate of the N-channel transistor 11 changes. Since such feedback control as above is exercised, the predetermined bias voltage $V_B$ at the node B becomes almost constant in a steady state.

FIG. 9 is a praph explaining a distribution of a current at each of components, shown in FIG. 8, contained in the feedback-type bias circuit 1 during operations. In FIG. 9, "$I_a$" represents currents corresponding to a voltage $V_{DS}$ between the drain and source of the N-channel transistor 14, and "$I_{a1}$" to "$I_{a6}$" represent characteristics of currents flowing through the N-channel transistor 14 which changes depending upon different voltages ($V_{G1}$ to $V_{G6}$) of the gate, while "$I_b$" represents currents corresponding to a voltage $V_{DS}$ between the drain and source of the P-channel transistor 15, and "$I_c$" represents characteristics of currents flowing through the circuit composed of the P-channel transistor 16 and the N-channel transistor 12. "$I_b+I_c$" represents a sum of currents flowing through the P-channel transistor 15, a current flowing through the P-channel transistor 16 and a current flowing through the N-channel transistor 12. At this point, the predetermined bias voltage $V_B$ at the node B is determined as a gate voltage ($V_G$) of the N-channel transistor 14 at a point P where the current $I_a$ and the current $I_b+I_c$ reach an equilibrium.

In the load circuit 2, while reading is performed, since the sense amplifier activating signal SAE goes high and the P-channel transistor 21 is turned ON, a current $I_1$ is supplied from the power source $V_{DD}$ through the N-channel transistor 22 constituting the constant current source load to the N-channel transistor 11 of the feedback-type bias circuit 1.

The pre-charging circuit 3 has a function to speed up a rise in the predetermined bias voltage $V_B$ at the node B at the time of reading operation by supplying a current $I_2$, which flows when the P-channel transistor 31 is turned ON after the bit line pre-charging signal ATDP goes low in an early stage of a read-out cycle, to the bit line through the N-channel transistor 32 operating in tandem with the N-channel transistor 11 of the feedback-type bias circuit 1.

A pre-charging circuit being similar to that described above is disclosed in, for example, Japanese Laid-open Patent Application No. Hei2-285593.

The sense circuit 4 is used to produce an output signal having a logical level being changed depending upon a level of the voltage $V_A$ relative to the reference voltage $V_{REF}$ by comparing the voltage $V_A$ at the node C with the reference voltage $V_{REF}$ from the reference circuit (not shown).

The latch circuit 5, by latching an output signal from the sense circuit 4 in response to the sense amplifier output latching signal LAT, is operated to output data "1" when the memory cell is in the ON-cell state and data "0" when the memory cell is in the OFF-cell state.

Next, operations of the reading circuit in the conventional non-volatile semiconductor device by referring to FIG. 8 will be described below.

In the bit line decoder $BDE_m$, when the bit line $BL_m$ is selected, the bit line selection signals a1 and a2 are high, the bit line selection transistors Tm1 and Tm2 are turned ON and the memory cell $M_{mn}$ is connected to the bit line $BL_m$. Moreover, by selecting the word line $WL_n$, the memory cell $M_{mn}$ is in a state allowing reading-out of either an ON-state or OFF-state.

In the early stage of the read-out cycle when the sense amplifier activating signal SAE goes high, the predetermined bias voltage $V_B$ of the node B becomes 0 (zero) volts. At this point, since the N-channel transistor 14 in the feedback-type bias circuit 1 is turned OFF and the voltage $V_F$ of the node A is maximum, the N-channel transistor 11 is turned ON and the current $I_1$ becomes maximum.

This causes an additional capacitor (having wiring capacitance, drain capacitance of the memory cell $M_{mn}$ or a like) of the bit line $BL_m$ to be pre-charged, resulting in a gradual increase in the voltage $V_B$ at the node B. When the predetermined bias voltage $V_B$ increases, a current flows through the N-channel transistor 14 and the voltage $V_F$ at the node A decreases, causing the current $I_1$ of the N-channel transistor 11 to decrease. Also, when feedback operations of the feedback-type bias circuit 1 converge on termination and the predetermined bias voltage $V_B$ at the node B reaches a predetermined memory cell drain voltage (for example, 0.5V), the memory cell $M_{mn}$ is in a state where a current can flow and, if it is in the ON-cell state, a memory cell current flows through the N-channel transistor 11, while, if it is in the OFF-cell state, the memory cell current does not flow. Therefore, since the voltage $V_A$ at the node C increases if the memory cell $M_{mn}$ is in the OFF-cell state (in an OFF-voltage state) and the voltage decreases if the memory cell $M_{mn}$ is in the ON-cell state (in an ON-voltage state), when an intermediate voltage between the ON voltage and the OFF voltage is produced as a reference voltage $V_{REF}$ from the reference circuit (not shown), the sense circuit 4 is adapted to compare the voltage $V_A$ with the voltage $V_{REF}$ and to produce an output showing the discrimination between the OFF-cell state and ON-cell state.

The latch circuit 5 is operated to latch an output signal of the sense circuit 4 in response to the sense amplifier output latching signal LAT and to output data "0" when the memory cell is in the OFF-cell state and data "1" when the memory cell is in the ON-cell state. In a pre-charging circuit 3 shown in FIG. 8, during a short time in the early stage of the read-out cycle when the sense amplifier activating signal SAE is active, the bit line pre-charging signal ATDP is low and the P-channel transistor 31 is turned ON causing the current $I_2$ to be supplied from the power source $V_{DD}$ to the bit line for pre-charging through the N-channel transistor 32 controlled in tandem with the N-channel transistor 11, which causes the rise of the predetermined bias voltage $V_B$ at the node B to be speeded up and the speed for the determination of the voltage $V_A$ at the node C to be improved.

FIG. 10 is a schematic block diagram of a reading timing generating circuit in the reading circuit shown in FIG. 8. The reading timing generating circuit is chiefly composed of an address change detecting signal generating circuit 101 and a pulse generating circuit 102. The address change detecting signal generating circuit 101 has an address change detecting circuit 103 adapted to detect a change point of address data contained in an external address inputting signal AO and to produce an address change detecting signal OS. The pulse generating circuit 102 is operated to produce, by internal pulse generating circuits (not shown) embedded therein and in response to the address change detecting signal OS, the sense amplifier activating signal SAE used to activate the reading circuit, the bit line pre-charging signal ATDP used to activate the pre-charging circuit 3 in the early stage of the read-out cycle when the sense amplifier activating signal SAE remains active and the sense amplifier output latching signal LAT used to latch an output from the sense circuit 4 at the latch circuit 5.

Next, reading operations in the conventional non-volatile semiconductor memory device will be described by referring to FIG. 11. A signal of each of components of the reading circuit in the conventional non-volatile semiconductor memory device shown in FIG. 8 are shown in FIG. 11. In response to external address inputting signals A0 to Ai, from the address change detecting signal generating circuit 101 (FIG. 10) is outputted the address change detecting signal OS, which causes the sense amplifier activating signal SAE from the pulse generating circuit 102* (FIG. 10) (in the drawings, a symbol "*" represents an inverted signal), the bit line pre-charging signal ATDP* and the sense amplifier output latching signal LAT to be produced. In the reading circuit shown in FIG. 8, the sense amplifier activating signal SAE* and the bit line pre-charging signal ATDP* are inputted as notinverted signals and an inactive state is changed to an active state.

In the feedback-type bias circuit 1, when the sense amplifier activating signal SAE* is generated, the P-channel transistors 15 and 16 are turned ON and the N-channel transistor 13 is turned OFF, which causes the current $I_1$ to be supplied to the bit line through the load circuit 2 and then the N-channel 11. When the bit line pre-charging signal ATDP* is produced in the early stage of the period when the sense amplifier activating signal SAE* is active, the current $I_2$ flows from the pre-charging circuit 3 through the bit line. Therefore, a current $I_M$ (=$I_1+I_2$) flows through the bit line and the pre-charging is done. When the feedback operation in the feedback-type bias circuit 1 is complete and the pre-charging by the pre-charging circuit 3 is then complete, the voltage $V_A$ at the node C is determined to be an OFF-bit potential $V_A$ (OFF) or an ON-bit potential $V_A$ (ON) depending upon the OFF-state or ON-state of the memory cell. The latch circuit 5 is operated to latch an output of a sense circuit 4 in response to the sense amplifier output latching signal LAT. However, though the conventional non-volatile semiconductor memory device shown in FIG. 8 is provided with the pre-charging circuit 3 to shorten time required for pre-charging the bit line, since much time is required before the reading of data becomes enabled after the bit line is pre-charged, the speed-up of operations in the non-volatile semiconductor memory device is interfered with.

FIGS. 12A and 12B are enlarged views showing changes in voltages and currents occurring when a reading output is generated in the reading circuit of the conventional non-volatile semiconductor memory device shown in FIG. 8 and also explaining the determination of outputted states, in which FIG. 12A shows changes in voltages and FIG. 12B shows changes in currents. In the conventional reading circuit shown in FIG. 8, read-out data is determined after a certain period of time elapses since the bit line pre-charging signal ATDP becomes inactive. As reasons for such delays in the determination of the read-out data in the conventional reading circuit, following two points can be considered.

(1) In the pre-charging circuit 3, when the bit line pre-charging signal ATDP has become inactive and the P-channel transistor 31 has been turned OFF, a potential on the outputting side (i.e., at the drain) of the P-channel transistor 31 rises to the power source voltage $V_{DD}$. Since there is the additional capacitor having the wiring capacitance, drain capacitance or a like on the outputting side of the P-channel transistor 31, the current $I_2$ flows, after the bit line pre-charging signal ATDP becomes inactive, by an electrical charge occurring during charging of the capacitor so that its potential rises to the power source voltage $V_{DD}$. However, since a current $I_M$ flowing through the bit line is constant, time is required before a cell current $I_1$ (it is a memory cell current at this point) flowing through the N-channel transistor 11 decreases and the ON-bit potential $V_A$ (ON), which is a reading voltage used when the memory cell is in the ON-cell state, is determined. In FIG. 12B, "t" represents time causing a decrease in data reading speed, based on the current $I_2$, appearing after the bit line pre-charging signal ATDP becomes inactive.

(2) When the output of the feedback-type bias circuit 1 is turned OFF, the bit line is pre-charged until the predetermined bias voltage $V_B$ at the node B is changed to its OFF level and, in this state, the voltage $V_A$ at the node C is determined. The same operations as above are carried out in the reference circuit (not shown) generating the reference voltage $V_{REF}$. In the sense circuit 4, a comparison between the voltage $V_A$ and the voltage $V_{REF}$ is made, however, at this point, since the voltage $V_A$ at the node C rises to a level (i.e., a differential operation point) exceeding that allowing the comparison operations of the sense circuit 4, much time is required before the voltage $V_A$ reaches a value at a differential operation point, thus causing the decrease in the reading speed. In order to decrease a difference between the ON-bit potential and OFF-bit potential in the voltage $V_A$ at the node C, a load used to flow a leak current is connected to the bit line, however, if the current $I_1$ flowing through the feedback-type bias circuit 1 is 0 (zero), the voltage $V_A$ at the node C rises nearly to the power source voltage $V_{DD}$. This is because it takes time for the voltage $V_A$ at the node C that is raised by over-charging to drop to the differential operation point value due to flowing of a current through the N-channel transistor 11 and due to drawing of electrical charges from the node C having the voltage $V_A$. In contrast, in the reference circuit, since the memory cell being in the ON-cell state is always connected, no rise occurs in the voltage $V_{REF}$.

SUMMARY OF THE INVENTION

In view of the above, it is an object of the present invention to provide a non-volatile semiconductor memory device capable of shortening time required for determining a reading voltage and of improving a data reading speed.

According to a first aspect of the present invention, there is provided a non-volatile semiconductor memory device including:

a bias voltage supplying circuit for supplying a predetermined bias voltage to a bit line by letting a current flow from a load circuit, in response to a first timing signal produced when an address of a memory cell is selected, to the memory cell to be connected to the bit line by a bit line selecting circuit in accordance with selection of the address and for generating a reading voltage at a point of connection with the load circuit by letting a current flow in accordance with an ON-state or OFF-state of the memory cell, a pre-charging circuit for letting a current flow to the bit line in response to a second timing signal produced in an early stage when the second timing signal is active; and whereby the pre-charging circuit is operated to interrupt a current in a last stage when the second timing signal is active.

By configuring as above, a delay occurring at a time of completion of pre-charging caused by discharging currents from an additional capacitor of the pre-charging circuit can be reduced and a data reading speed can be improved.

In the foregoing, a preferable mode is one wherein the load circuit is composed of switching circuit which is turned ON in response to the first timing signal connected to a constant current source circuit in series.

Also, a preferable mode is one wherein the switching circuit is composed of a P-channel transistor, a source of which is connected to a power source, to a gate of which the first timing signal is supplied and a drain of which is connected to the constant current source circuit and wherein the constant current source is composed of an N-channel transistor, a drain of which is connected to the drain of the P-channel transistor, a gate of which is connected to said drain of the N-channel transistor and a source of which is connected to the bias voltage supplying circuit.

Also, a preferable mode is one wherein the bias voltage supplying circuit is composed of a feedback-type bias circuit having current controlling circuit operated to let a current flow from a power source through the load circuit to said bit line in response to a control signal and feedback circuit operated to feed a signal a voltage of which is dropped when a current flows from current supplying circuit in accordance with a bias voltage occurring at the bias line, as the control signal, back to the current controlling circuit.

Also, a preferable mode is one wherein the current controlling circuit is composed of an N-channel transistor, a source of which is connected to the load circuit, to a gate of which the control signal is supplied, and a drain of which is connected to the bit line, and wherein the feedback circuit is composed of an N-channel transistor, a source of which is connected to a ground, to a gate of which the bias voltage is applied and a drain of which is connected to the current supplying circuit and wherein the control signal is outputted from a point of connection between the drain of the N-channel transistor and the current supplying circuit.

Also, a preferable mode is one wherein the current supplying circuit is composed of a first current supplying section which is turned ON in response to the first timing signal and a second current supplying section to which switching circuit to be turned ON in response to the first timing signal and a constant current source circuit are connected in series, the first current supplying section and second current supplying section being connected, in parallel, between a power source and the feedback circuit.

Also, a preferable mode is one wherein the first current supplying section is composed of a first P-channel transistor, a source of which is connected to a power source, to a gate of which the first timing signal is supplied and a drain of which is connected to the feedback circuit and wherein the second current supplying section is composed of a second P-channel transistor, a source of which is connected to a power source, to a gate of which the first timing signal is supplied and a drain of which is connected to a drain of an N-channel transistor and the N-channel transistor, the drain of which is connected to the drain of the second P-channel transistor, a gate of which is connected to the drain of the N-channel transistor and a source of which is connected to the feedback circuit.

Also, a preferable mode is one that wherein includes grounding circuit, connected in parallel to the feedback circuit, used to connect a terminal of a control signal output from the feedback circuit to a ground while the first timing signal is inactive.

Also, a preferable mode is one wherein the grounding circuit is composed of an N-channel transistor, a drain of which is connected to a drain of the N-channel transistor constituting the feedback circuit, to a gate of which the first timing signal is supplied and a source of which is connected to a ground.

Also, a preferable mode is one wherein the pre-charging circuit is composed of first switching mean which is turned ON in response to the second timing signal, current controlling mean used to control a current in response to the control signal connected between a power source and the bit line and second switching circuit which is turned OFF in response to a inverted signal of the second timing signal connected between the power source and the bit line.

Also, a preferable mode is one wherein the first switching circuit is composed of a P-channel transistor, a source of which is connected to a power source, to a gate of which the second timing signal is supplied and a drain of which is connected to the current controlling section and wherein the current controlling section is composed of a first N-channel transistor, a drain of which is connected to the drain of the P-channel transistor, to a gate of which the control signal is supplied and a source of which is connected to the second switching circuit, and wherein the second switching circuit is composed of a second N-channel transistor, a drain of which is connected to the drain of the first N-channel transistor, to a gate of which the second timing signal is supplied through an inverter and a source of which is connected to the bit line.

Also, a preferable mode is one wherein the pre-charging circuit is composed of a current controlling section used to let a current flow from a power source in response to the control signal connected between the power source and the bit line and of switching circuit which is turned OFF in response to the second timing signal connected between the power source and the bit line.

Also, a preferable mode is one wherein the current controlling section is composed of an N-channel transistor, a drain of which is connected to a power source, to a gate of which the control signal is supplied and a source of which is connected to the switching circuit and wherein the switching circuit is composed of a P-channel transistor, a source of which is connected to the source of the N-channel transistor, to a gate of which the second timing signal is supplied and a drain of which is connected to the bit line.

Also, a preferable mode is one that wherein comprises equalizing circuit used to establish a short-circuit between a point of connection between the load circuit and the current controlling circuit and an input side of the current controlling circuit in a last stage while the second timing signal is active.

By mounting the equalizing circuit, the short-circuit between the load circuit and current controlling circuit is established in a last stage when the bit line pre-charging signal is active and, if the voltage at the outputting terminal of the load is too high or too low, the voltage is forcedly caused to have an intermediate value between a voltage corresponding to the ON-cell state and a voltage corresponding to the OFF-cell state in the last stage when pre-charging the bit line is active, thereby preventing a delay in timing for determination of the reading voltage and thus improving the data reading speed.

Furthermore, a preferable mode is one wherein the equalizing circuit is composed of an N-channel transistor, a drain of which is connected to the drain of the N-channel transistor constituting the current controlling circuit, to a gate of which a third timing signal produced in a last stage while the second timing signal is active is supplied and a source of which is connected to a gate of the N-channel transistor constituting the current controlling circuit.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
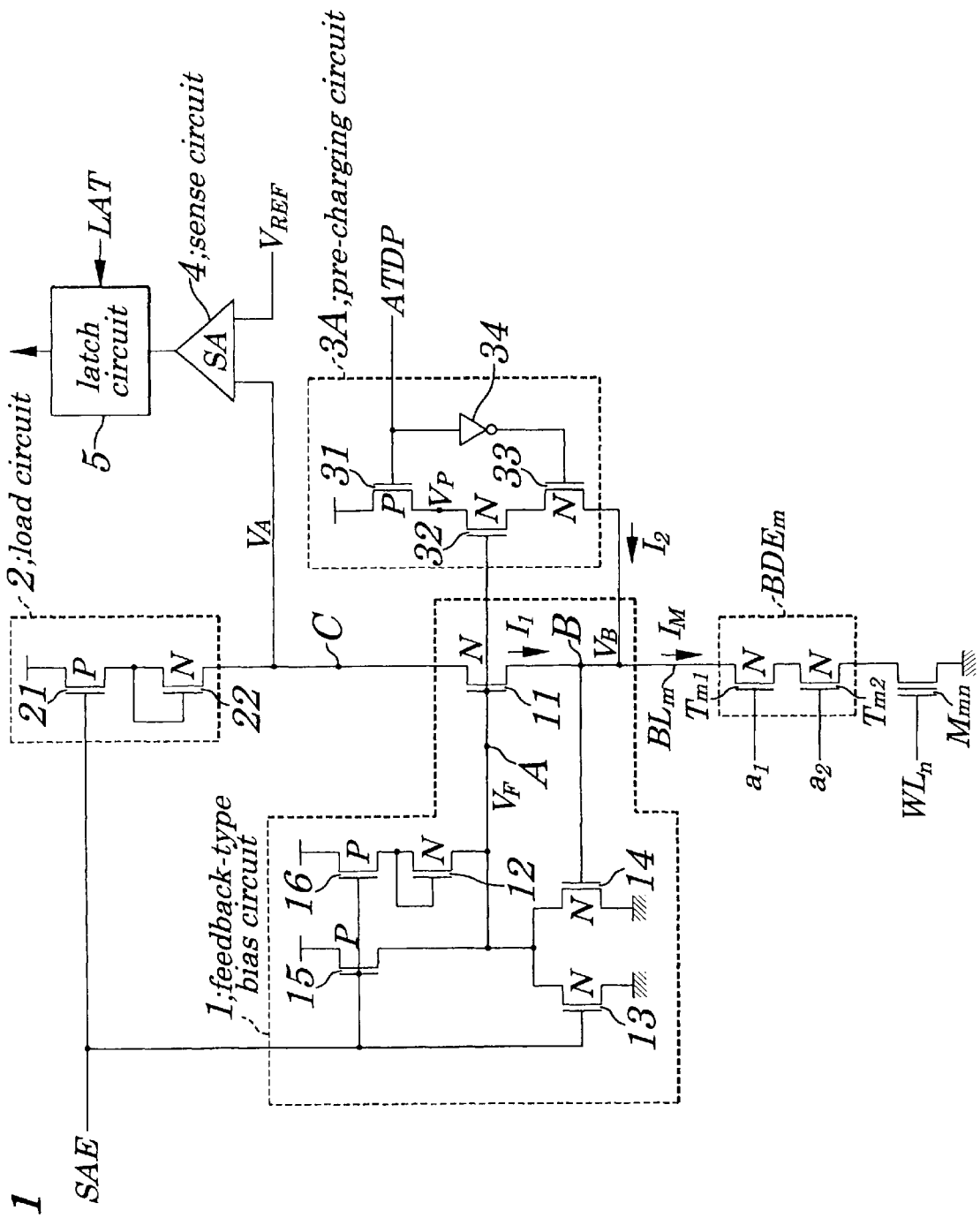
FIG. 1 is a schematic circuit diagram showing configurations of a reading circuit in a non-volatile semiconductor memory device according to a first embodiment of the present invention.
Figure 8:
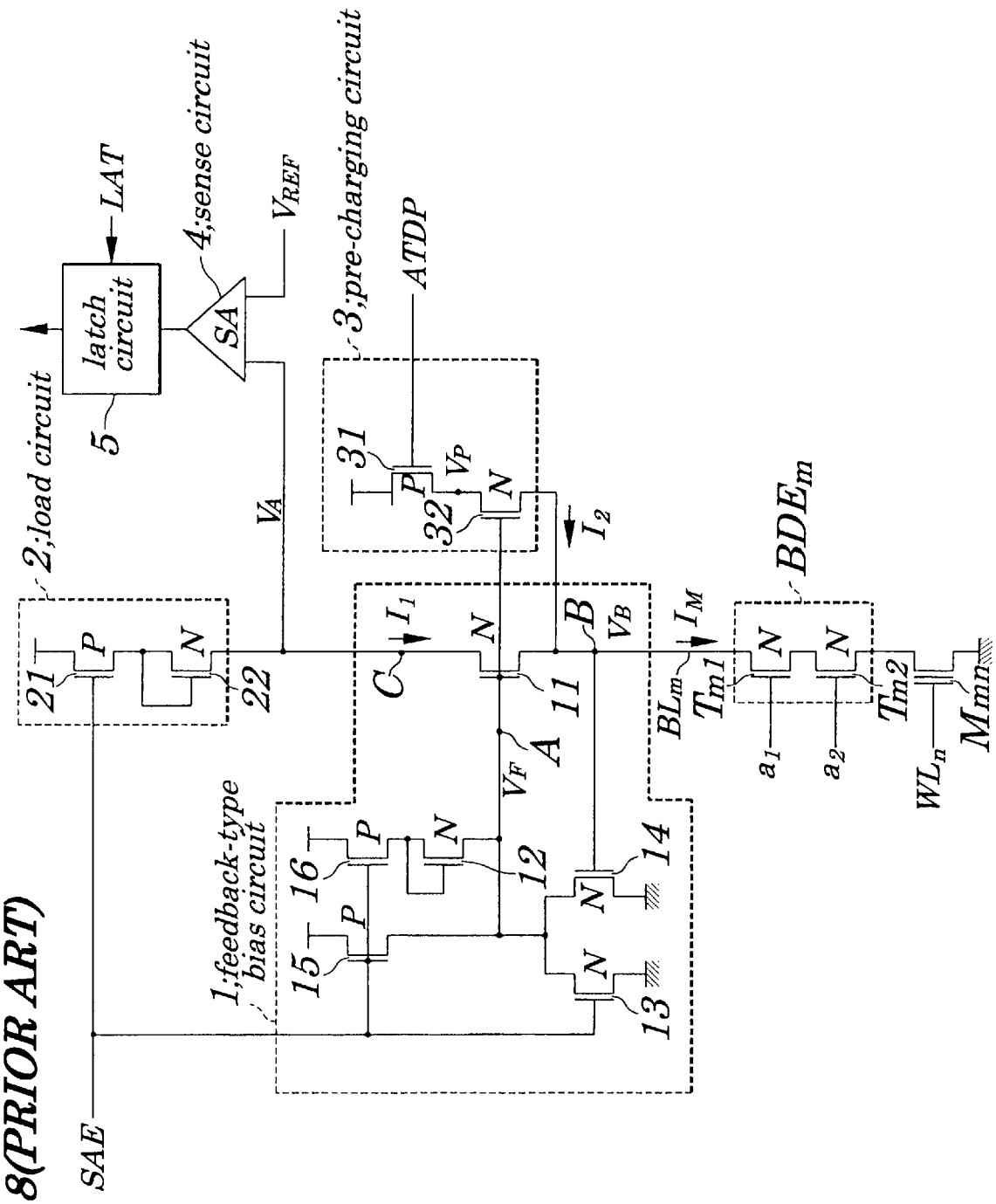
FIG. 8 is a schematic circuit diagram showing an example of configurations of a reading circuit in a conventional nonvolatile semiconductor memory device.
Figure 9:
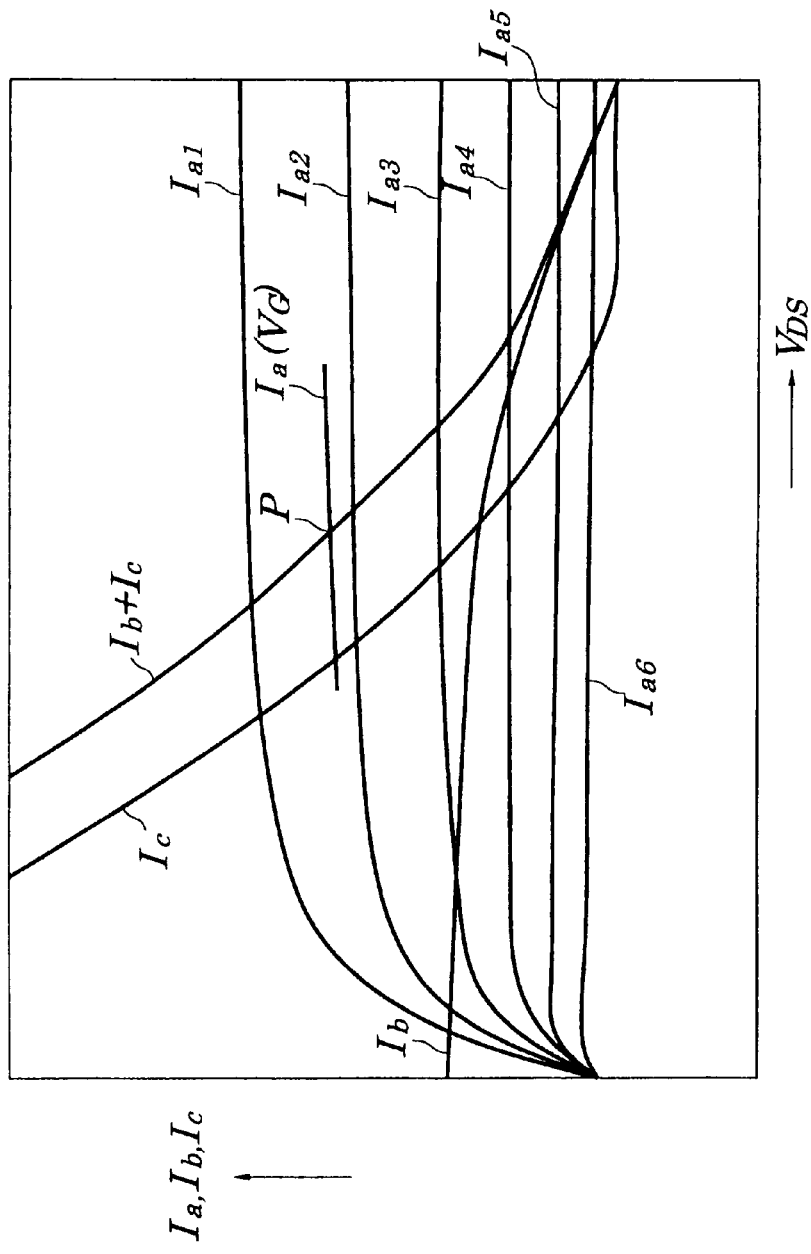
FIG. 9 is a graph explaining operations of the conventional feedback-type bias circuit of the conventional non-volatile semiconductor memory device.
Figure 10:
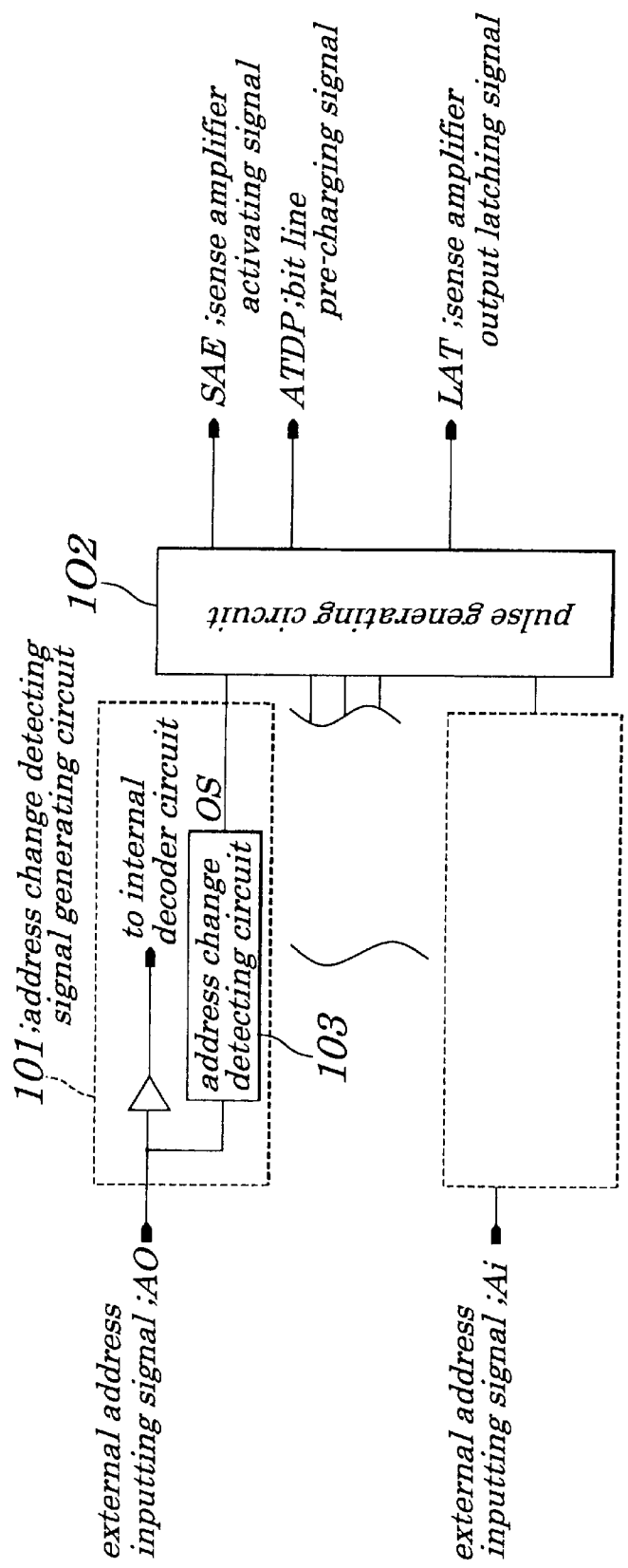
FIG. 10 is a schematic block diagram of a reading timing generating circuit used for the conventional non-volatile semiconductor memory device.
Figure 11:
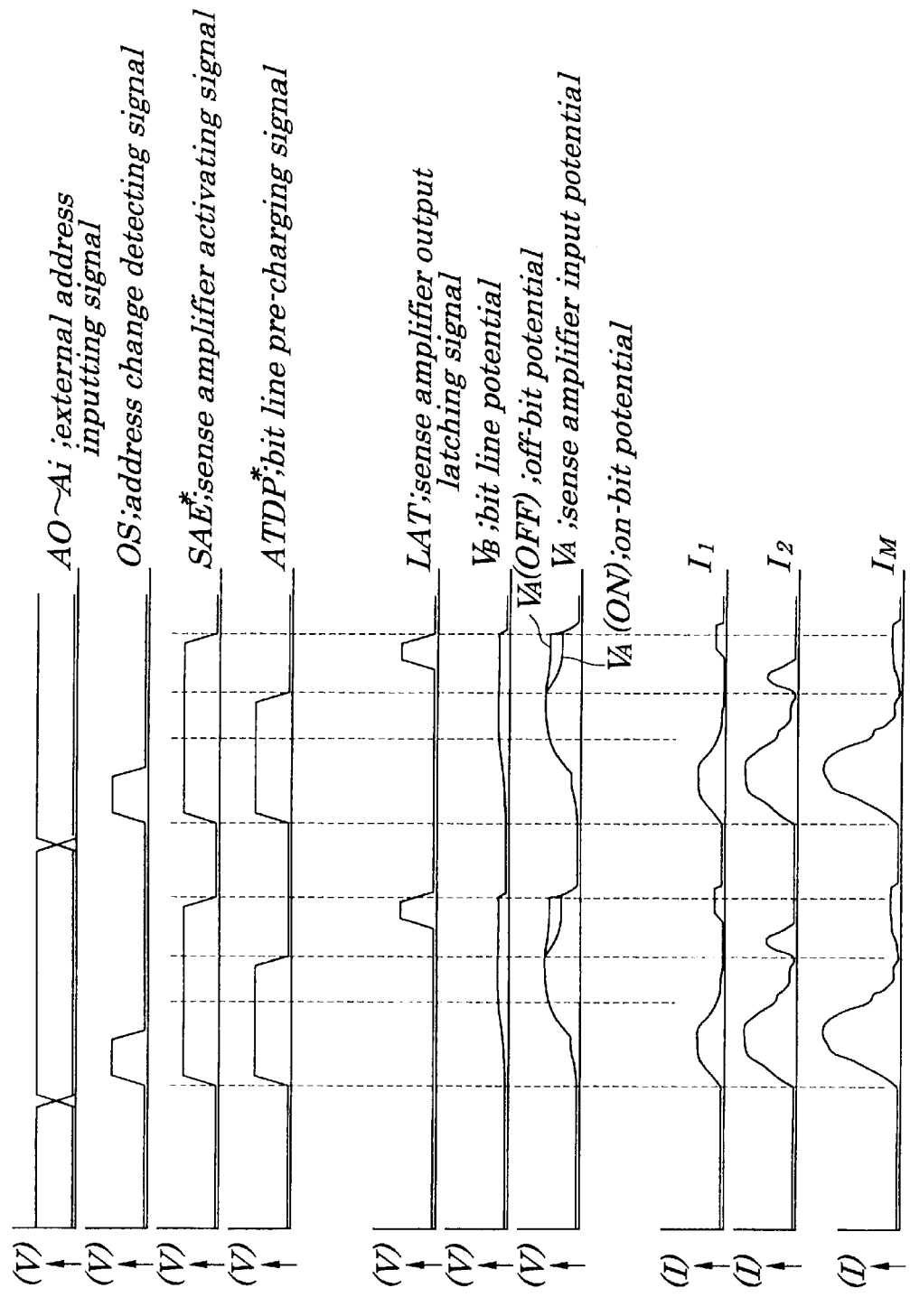
FIG. 11 is a timing chart showing reading operations in the conventional non-volatile semiconductor memory device.
Figure 12A:
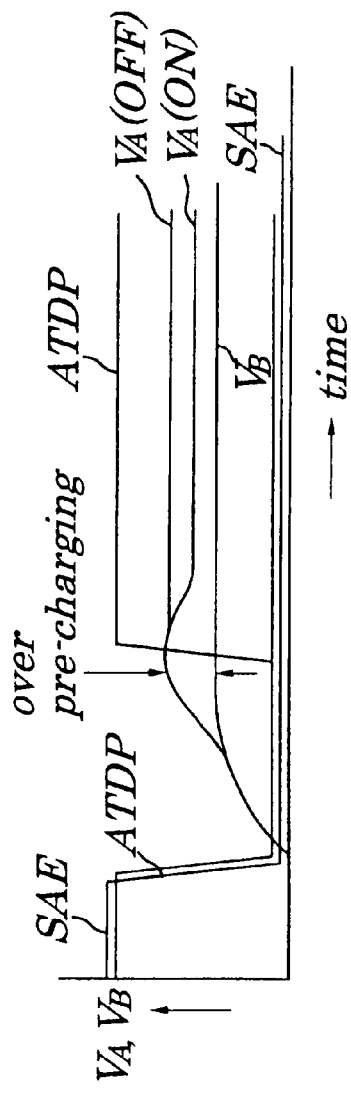
FIGS. 12A and 12B are diagrams explaining determination of an outputting state for reading in the conventional non-volatile semiconductor memory device.
Figure 12B:
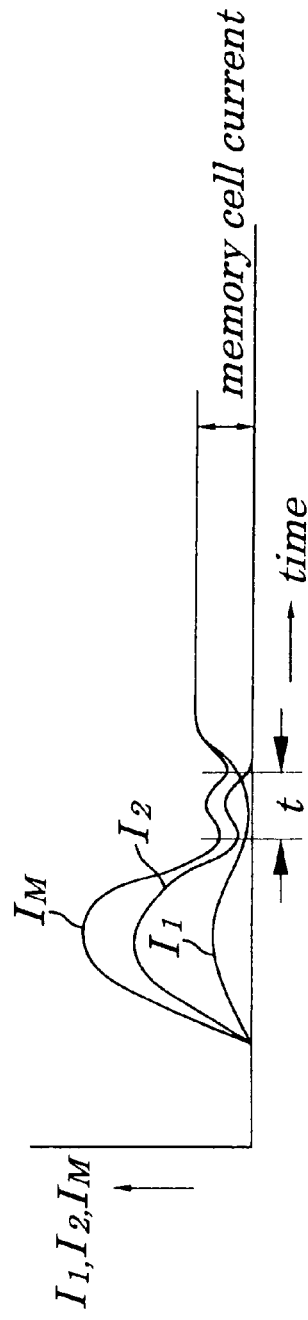

FIG. 1 is a schematic circuit diagram showing configurations of a reading circuit in a non-volatile semiconductor memory device according to a first embodiment of the present invention. As shown in FIG. 1, the reading circuit in the non-volatile semiconductor memory device of this embodiment is chiefly composed of a memory cell $M_{mn}$ a bit line decoder $BDE_m$, a feedback-type bias circuit 1, a load circuit 2, a pre-charging circuit 3A, a sense circuit (SA) 4 and a latch circuit 5. Configurations of the feedback-type bias circuit 1, the load circuit 2, the sense circuit 5 and the latch circuit 5 of this embodiment are the same as those shown in FIG. 8. Configurations of this embodiment differ greatly from those in FIG. 8 in that the pre-charging circuit 3A is provided which has different structures from those in the pre-charging circuit 3 of FIG. 8. The pre-charging circuit 3A has a P-channel transistor 31, N-channel transistors 32 and 33 and an inverter 34. A source of the P-channel transistor 31 is connected to a power source $V_{DD}$, its drain is connected to a drain of the N-channel transistor 32 and its gate is connected to a line of a bit line pre-charging signal ATDP. A source of the N-channel transistor 32 is connected to a drain of the N-channel transistor 33 and its gate is connected to a node A. A source of the N-channel transistor 33 is connected to a node B and its gate is connected to an outputting terminal of the inverter 34. An inputting terminal of the inverter 34 is connected to the line of the bit line pre-charging signal ATDP.

In the pre-charging circuit 3A, by making the bit line pre-charging signal ATDP low in an early stage of a read-out cycle, the P-channel transistor 31 is turned ON and, by supplying a current $I_2$ to a bit line through the N-channel transistor 32 operating in tandem with an N-channel transistor 11 of the feedback-type bias circuit 1, a rise in a predetermined bias voltage $V_B$ at the node B at a time of reading operations is speeded up. Moreover, when the bit line pre-charging signal ATDP goes low, the N-channel transistor 33 is turned OFF, which forcedly interrupts the current $I_2$ to the bit line.

Next, operations of the reading circuit in the non-volatile semiconductor memory device of this embodiment will be described below by referring to FIG. 1.

When the bit line $BL_m$ is selected, in the bit line decoder $BDE_m$, bit line selection signals a1 and a2 are high, bit line selecting transistors $T_{m1}$ and $T_{m2}$ are turned ON and the memory cell $M_{mn}$ remains connected to the bit line $BL_m$. Moreover, when a word line $WL_n$ is selected, the memory cell $M_{mn}$ is in a state allowing reading-out of either an ON-state or OFF-state.

In the early stage of the read-out cycle when a sense amplifier activating signal SAE goes low, the predetermined bias voltage $V_B$ at the node B becomes 0 (zero) volts. In this state, in the feedback-type bias circuit 1, the N-channel transistor 14 is turned OFF and a voltage $V_F$ at the node A is maximum, while the N-channel transistor 11 is turned ON and a current $I_1$ is maximum. This causes an additional capacitor (having wiring capacitance, drain capacitance of the memory cell $M_{mn}$ or a like) of the bit line $BL_m$ to be pre-charged, resulting in a gradual increase in the predetermined bias voltage $V_B$ at the node B. At this point, in a pre-charging circuit 3A. In the early stage of the read-out cycle, when the bit line pre-charging signal ATDP becomes low, the P-channel transistor 31 is turned ON causing the current $I_2$ to the bit line through the N-channel transistor 32 operating in tandem with the N-channel transistor 11 in the feedback-type bias circuit 1, which causes a rise of the predetermined bias voltage $V_B$ at the node B in the reading operation to be speeded up.

When the predetermined bias voltage $V_B$ increases, a current flows through the N-channel 14, causing the voltage $V_F$ at the node A to decrease and the current $I_1$ of the N-channel transistor 11 to be reduced. By such feedback operations, the N-channel transistor 11 is turned OFF and the current $I_1$ used to pre-charge the bit line approaches 0 (zero). When the feedback operation of the feedback-type bias circuit 1 converges on termination and the predetermined bias voltage $V_B$ at the node B reaches a predetermined memory drain voltage (for example, 0.5V), the memory cell $M_{mn}$ changes to a state allowing a current to flow, and if the memory cell is in an ON-cell state, the current $I_1$ based on a memory cell current starts flowing through the N-channel transistor 11, however, if it is in an OFF-cell state, the memory cell current does not flow.

At this point, when the bit line pre-charging signal ATDP goes high, the N-channel transistor 33 is controlled so as to be turned OFF and the pre-charging path is closed and, therefore, in the pre-charging circuit 3A, a outflow of currents $I_2$ caused by discharging of electrical charges having a potential near the power supply voltage $V_{DD}$ from the additional capacity containing wiring capacitance or other capacitance held by the P-channel transistor 31 or a like, is stopped, resulting in a rapid increase in the current $I_1$.

Since the voltage $V_A$ at the node C is high when the memory cell is in the OFF-cell state (at an OFF-bit potential) and is low when the memory cell is in the ON-cell state (at an ON-bit potential), the reference circuit (not shown) is adapted to output an intermediate voltage between the OFF voltage and ON voltage as a reference voltage $V_{REF}$ so that the sense circuit 4 can compare the voltage $V_A$ with the $V_{REF}$ and can generate an output showing discrimination of the OFF-cell state from the ON-cell state. The latch circuit 5 is operated to latch an output signal from the sense circuit 4 and to output, for example, data "0" when the memory cell is in the OFF-cell state and data "1" when the memory cell is in the ON-cell state.

Thus, in the reading circuit in the non-volatile semiconductor memory device of this embodiment, since the outflow of the current $I_2$ from the pre-charging circuit 3A is prevented when the bit line pre-charging signal ATDP becomes inactive, outputting of the memory cell current from the feedback-type bias circuit 1 is speeded up and a delay in the determination of the voltage $V_A$ at the node C caused by discharging of electrical charges from the additional capacitor in the pre-charging circuit is resolved, thus improving the data reading speed.

Second Embodiment

Figure 2:
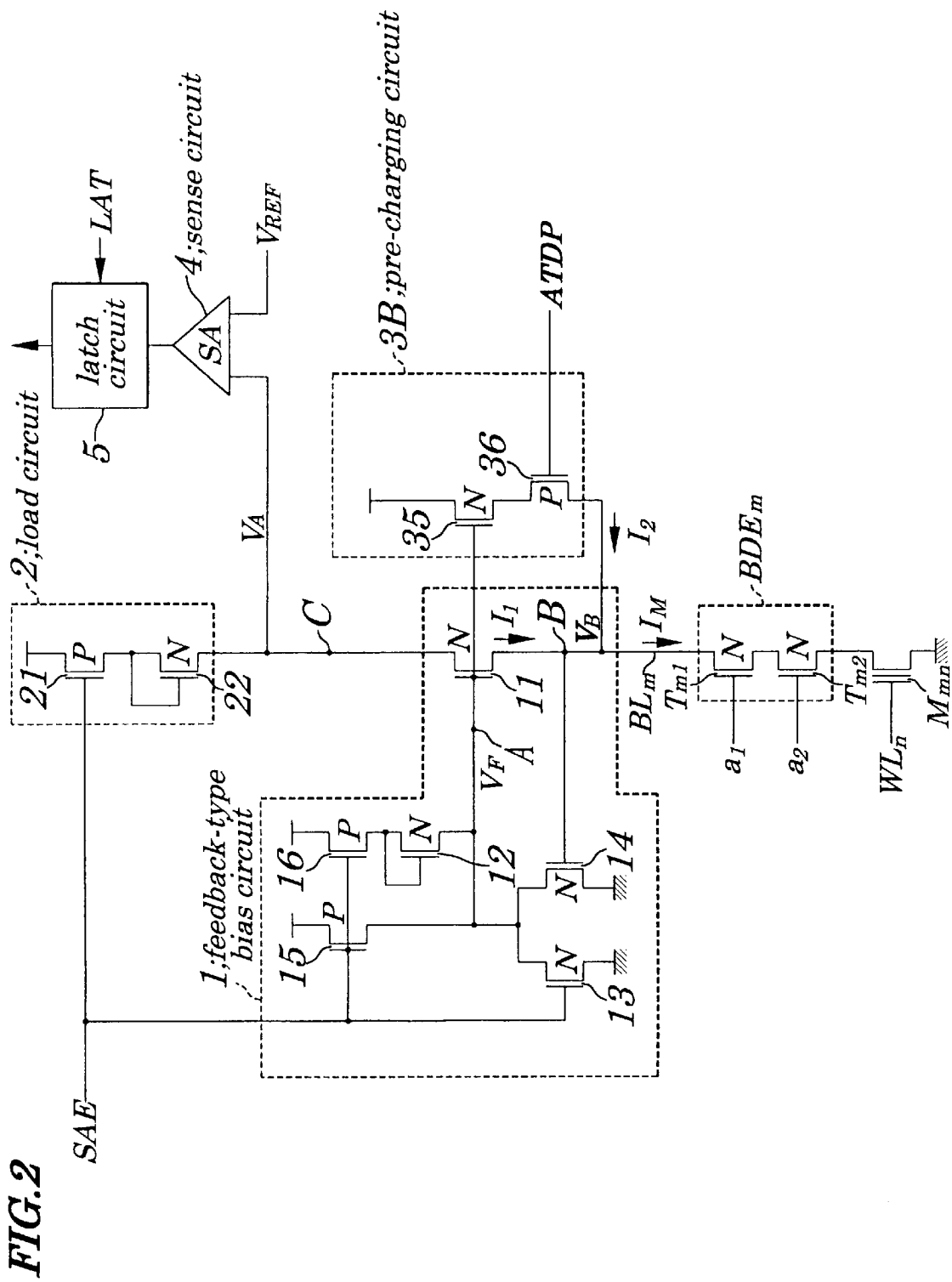
FIG. 2 is a schematic circuit diagram showing configurations of a reading circuit in a non-volatile semiconductor memory device according to a second embodiment of the present invention.

FIG. 2 is a schematic circuit diagram showing configurations of a reading circuit in a non-volatile semiconductor memory device according to a second embodiment of the present invention. As shown in FIG. 2, the reading circuit of this embodiment is chiefly composed of a memory cell $M_{mn}$, a bit line decoder $BDE_m$, a feedback-type bias circuit 1, a load circuit 2, a pre-charging circuit 3B, a sense circuit (SA) 4 and a latch circuit 5. Configurations of the feedback-type bias circuit 1, load circuit 2, sense circuit 4 of this embodiment and latch circuit 5 are the same as those of the first embodiment. Configurations of this embodiment differ greatly from those of the first embodiment in that the pre-charging circuit 3B is provided which has different structures from those in the pre-charging circuit 3A of the first embodiment. The pre-charging circuit 3B has an N-channel transistor 35 and a P-channel transistor 36. A drain of the N-channel transistor 35 is connected to a power source $V_{DD}$, its source is connected to a source of the P-channel transistor 36 and its gate is connected to a node A. A drain of the P-channel transistor 36 is connected to a node B and its gate is connected to a line of a bit line pre-charging signal ATDP.

In the pre-charging circuit 3B, when the bit line pre-charging signal ATDP goes low in early stages of a read-out cycle, the P-channel transistor 36 is turned ON and a current $I_2$ is applied to a bit line from the power source $V_{DD}$ through the N-channel transistor 35 and the P-channel transistor 36 operating in tandem with an N-channel transistor 11 of the feedback-type bias circuit 1, a rise in a predetermined bias voltage $V_B$ at the node B at a time of reading operations is speeded up. Moreover, when the bit line pre-charging signal ATDP goes high, the P-channel transistor 36 is turned OFF and the pre-charging path is closed and, therefore, in the pre-charging circuit 3B, a outflow of currents $I_2$ caused by discharging of electrical charges having a potential near the power supply voltage $V_{DD}$ from the additional capacity containing wiring capacitance or other capacitance held by the P-channel transistor 36 or a like, can be stopped.

Next, operations of the reading circuit in the non-volatile semiconductor memory device will be described by referring to FIG. 2. Only one difference in operations between the reading circuit of this embodiment and of the first embodiment exists in the pre-charging circuit 3B and therefore operations of the pre-charging circuit 3B are mainly described below. In an early stage of a read-out cycle, when a current $I_1$ flows, an additional capacitor (containing wiring capacitance, drain capacitance of the memory cell $M_{mn}$ or a like) of a bit line $BL_m$ is pre-charged and the predetermined bias voltage $V_B$ of the node B increases gradually. At this point, in the pre-charging circuit 3B, when the bit line pre-charging signal ATDP goes low in early stages of the read-out cycle, the P-channel transistor 36 is turned ON and a current $I_2$ is applied from the power source $V_{DD}$ to a bit line through the N-channel transistor 35 and the P-channel transistor 36 operating in tandem with an N-channel transistor 11 of the feedback-type bias circuit 1, a rise in the predetermined bias voltage $V_B$ at the node B at a time of reading operations is speeded up.

When the predetermined bias voltage $V_B$ increases, a voltage $V_F$ at the node A decrease and the current $I_1$ of the N-channel transistor 11 is reduced, and by such feedback operations, the N-channel transistor 11 is turned OFF and the current $I_1$ used to pre-charge the bit line approaches 0 (zero). When the feedback operation of the feedback-type bias circuit 1 converges on termination and the predetermined bias voltage $V_B$ at the node B reaches a predetermined memory drain voltage (for example, 0.5V), the memory cell $M_{mn}$ changes to a state allowing a current to flow, and if the memory cell is in an ON-cell state, the current $I_1$ based on a memory cell current starts flowing through the N-channel transistor 11

At this point, when the bit line pre-charging signal ATDP goes high, the N-channel transistor 36 is controlled so as to be turned OFF and the pre-charging path is closed and, therefore, in the pre-charging circuit 3B, an outflow of currents $I_2$ caused by discharging of electrical charges having a potential near the power supply voltage $V_{DD}$ from the additional capacity containing wiring capacitance or other capacitance held by the N-channel transistor 35 or a like, is stopped, resulting in a rapid increase in the current $I_1$ while the memory cell is in the ON-cell state.

Thus, in the reading circuit in the non-volatile semiconductor memory device of this embodiment, since the outflow of the current $I_2$ from the pre-charging circuit 3B is prevented when the bit line pre-charging signal ATDP becomes inactive, outflow of the memory cell current from the feedback-type bias circuit 1 is speeded up and such a delay in the determination of the voltage $V_A$ at a node C caused by discharging of electrical charges from the additional capacitor in the pre-charging circuit is resolved, thus improving the data reading speed.

Third Embodiment

Figure 3:
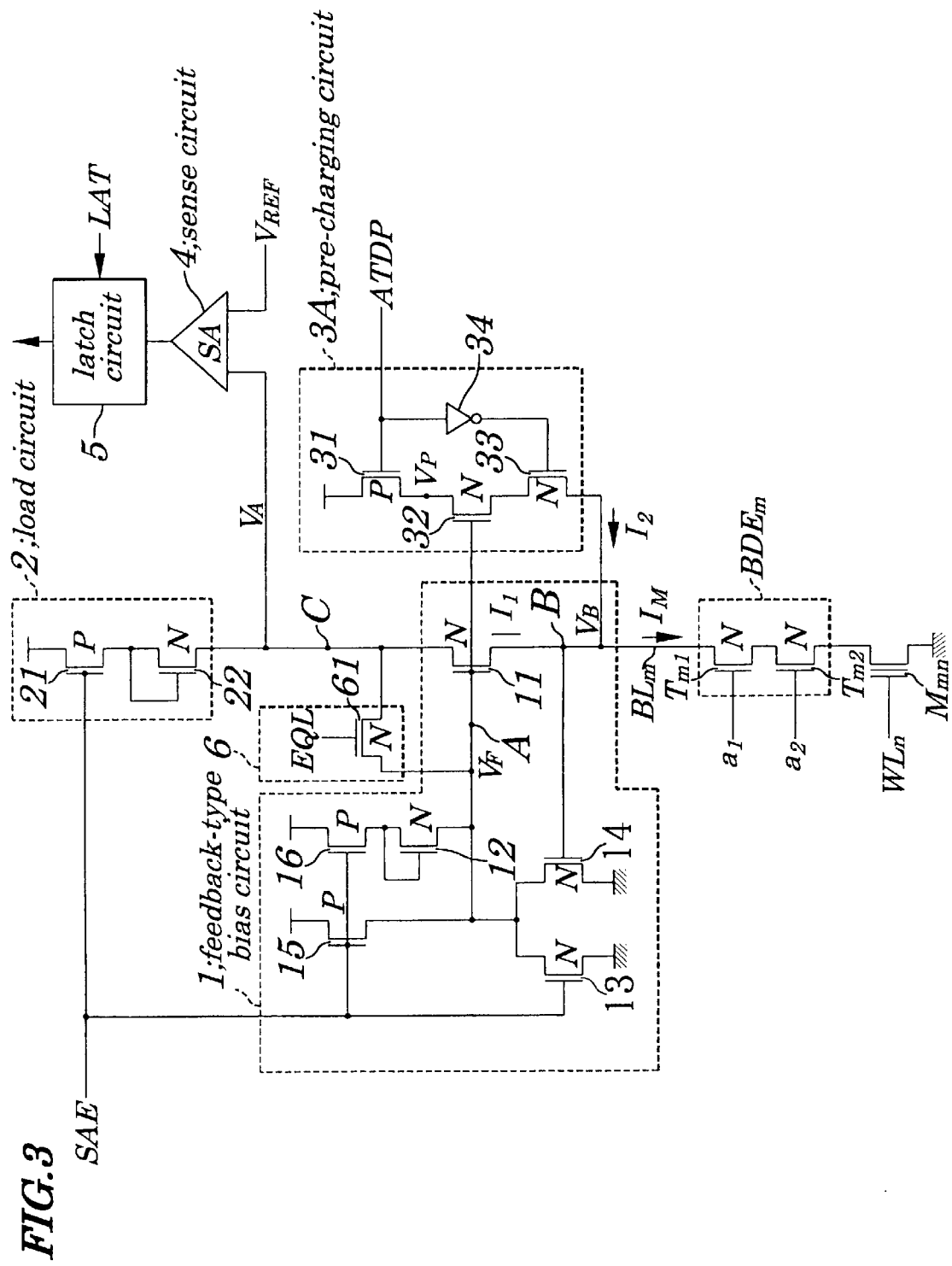
FIG. 3 is a schematic circuit diagram showing configurations of a reading circuit in a non-volatile semiconductor memory device according to a third embodiment of the present invention.
Figure 4:
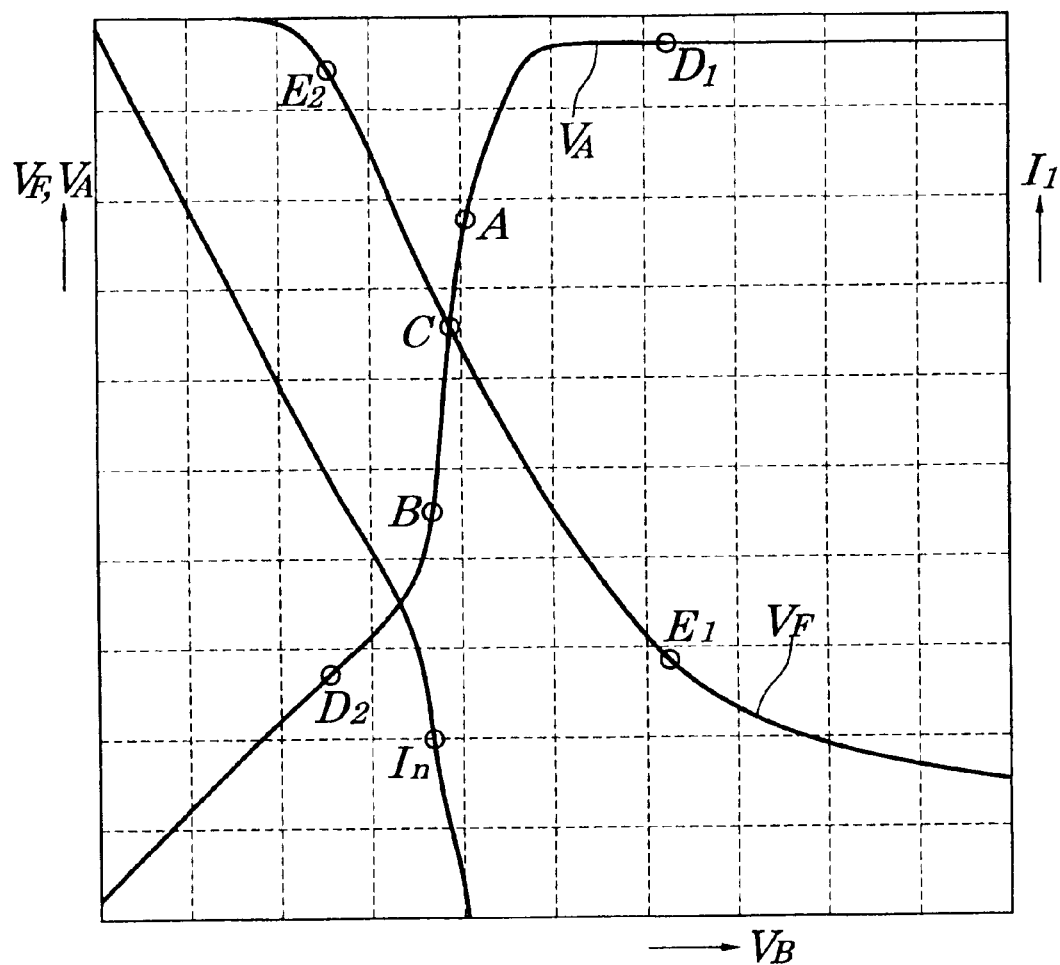
FIG. 4 is a graph showing relations among voltages and currents in the reading circuit in the non-volatile semiconductor memory device of the third embodiment.
Figure 5:
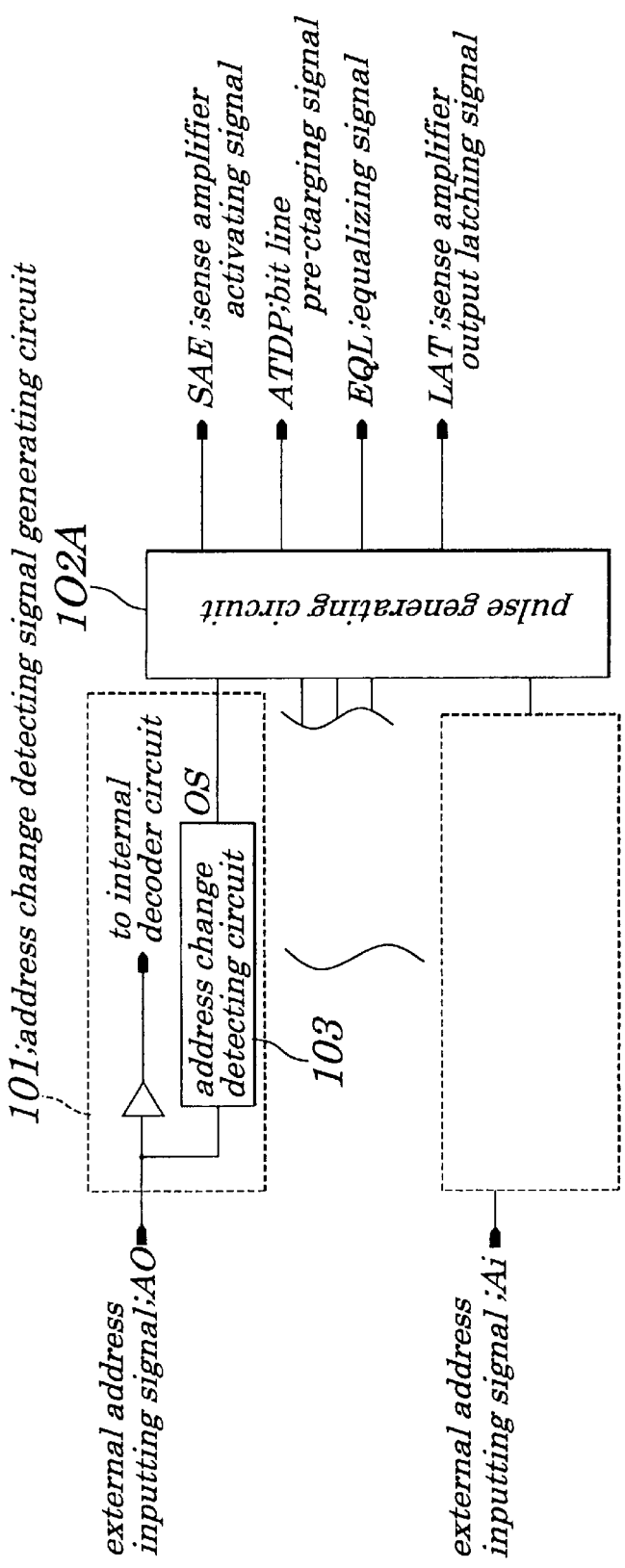
FIG. 5 is a schematic block diagram of a reading timing generating circuit used for the non-volatile semiconductor memory device of the third embodiment.
Figure 6:
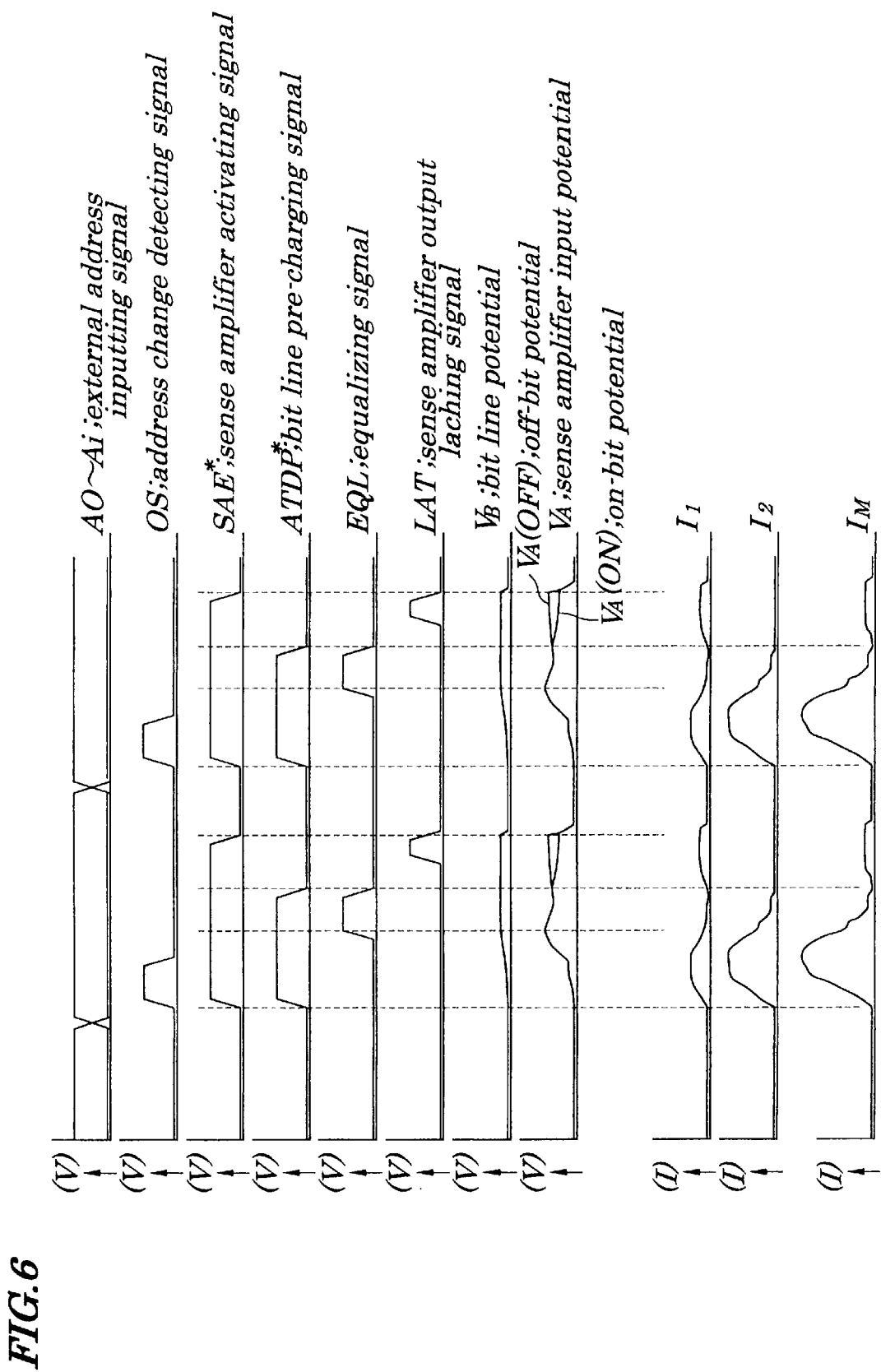
FIG. 6 is a timing chart showing reading operations in the non-volatile semiconductor memory device of the third embodiment.
Figure 7A:
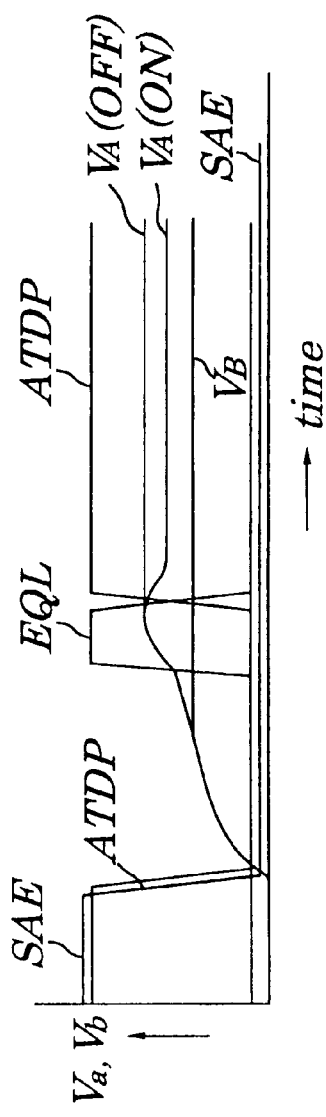
FIGS. 7A and 7B are diagrams explaining determination of an outputting state for reading in the non-volatile semiconductor memory device of the third embodiment.
Figure 7B:
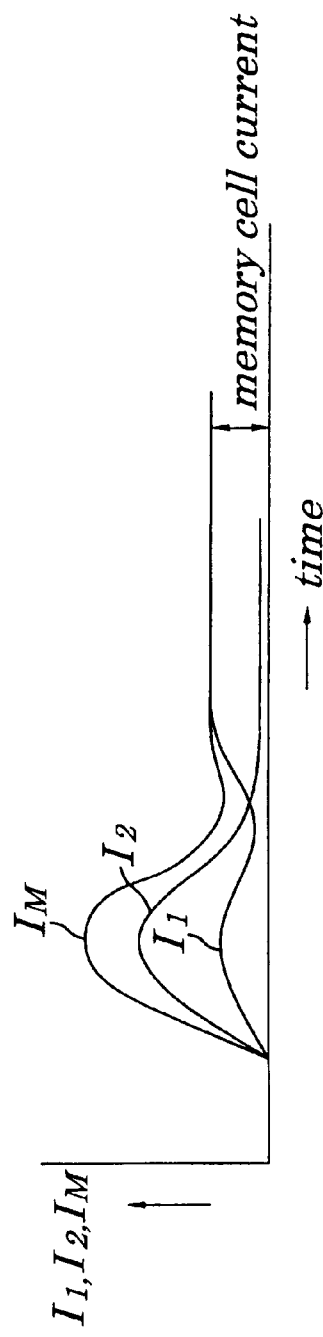

FIG. 3 is a schematic circuit diagram showing configurations of a reading circuit in a non-volatile semiconductor memory device according to a third embodiment of the present invention. FIG. 4 is a graph showing relations among voltages and currents in the reading circuit in the non-volatile semiconductor memory device of the third embodiment. FIG. 5 is a schematic block diagram of a reading timing generating circuit used for the non-volatile semiconductor memory device of the third embodiment. FIG. 6 is a timing chart showing reading operations in the non-volatile semiconductor memory device of the third embodiment. FIGS. 7A and 7B are diagrams explaining determination of an outputting state for reading in the nonvolatile semiconductor memory device of the third embodiment. As shown in FIG. 3, the reading circuit of this embodiment is chiefly composed of a memory cell $M_{mn}$, a bit line decoder $BDE_m$, a feedback-type bias circuit 1, a load circuit 2, a pre-charging circuit 3A, a sense circuit (SA) 4, a latch circuit 5 and an equalizing circuit 6.

Configurations of the feedback-type bias circuit 1, load circuit 2, pre-charging circuit 3A, sense circuit 4 and latch circuit 5 of this embodiment are the same as those of the first embodiment shown in FIG. 1 and differ greatly from those in the first embodiment in that the equalizing circuit 6 is additionally provided. The equalizing circuit is composed of an N-channel transistor 61. A drain of the N-channel transistor 61 is connected to a node C, its source is connected to a node A and its gate is connected to a line of an equalizing signal EQL. The equalizing circuit 6 is turned ON, when a bit line pre-charging signal ATDP becomes inactive, in response to the equalizing signal EQL occurring for a short time, thus equalizing a voltage $V_A$ at the node C to a voltage $V_F$ at the node A.

Operations of the equalizing circuit 6 are further described in detail by referring to FIG. 4.

In FIG. 4, an example of relations among voltages and currents appearing after a completion of pre-charging is shown by plotting a predetermined bias voltage $V_B$ at a node B as abscissa and by plotting the voltage $V_F$ at the node A and a current $I_1$ flowing to a bit line through the N-channel transistor 11 of the feedback-type bias circuit 1 as ordinate. The voltage $V_F$ at the node, in accordance with operations of the feedback-type bias circuit 1, becomes high when the predetermined bias voltage $V_B$ at the node B becomes low and becomes low when the predetermined bias voltage $V_B$ at the node B becomes high, which provides a characteristic of an inverter. In contrast, the voltage $V_A$ at the node C rises as the predetermined bias voltage $V_B$ at the node B become great and the voltage $V_A$ at the node C becomes constant when the predetermined bias voltage $V_B$ exceeds a predetermined level. The current $I_1$ is maximum when the predetermined bias voltage $V_B$ at the node B is zero volts, and as the predetermined bias voltage $V_B$ rises, the $I_1$ is decreased and becomes zero when the predetermined bias voltage $V_B$ is at a predetermined level. The voltage $V_A$ (represented by "A") corresponding to the predetermined bias voltage $V_B$ at which the current $I_1$ becomes zero shows an OFF-bit potential and the voltage $V_A$ (represented by "B" in FIG. 4) corresponding to the predetermined bias voltage $V_B$ at which the current $I_1$ becomes a set current $I_n$ of the memory cell shows an ON-bit potential. The voltages $V_F$ and $V_A$ (represented by "C" in FIG. 4) occurring when the voltage $V_F$ becomes equal to the voltage $V_A$ show the voltages occurring when a short-circuit between the nodes A and C are established by operations of the equalizing circuit 6.

If the bit line is over-charged due to problems of capability of the pre-charging circuit, the voltage $V_A$ at the node C is in a too high state (this state being shown as $D_1$ in FIG. 4) and, at this point, the voltage $V_F$ at the node C is in a too low state (this state being shown as $E_1$ in FIG. 4). On the other hand, the bit line is insufficiently pre-charged, the voltage $V_A$ at the node C is in the too low state (this state being shown as $D_2$ in FIG. 4) and, at this point, the voltage $V_A$ at the node C is in the too high state (this state being shown as $E_2$ in FIG. 4). When a short-circuit between the nodes A and B is established by operations of the equalizing circuit 6, since the voltage $V_A$ at the node C is forcedly changed to have the intermediate potential between the OFF-bit and ON-bit potential, the state in which the voltage $V_A$ is in the too high or too low state disappears, the voltage $V_A$ approaches a value of the differential operation point B where the OFF-bit and ON-bit potentials can be rapidly discriminated.

Thus, in the reading circuit in the non-volatile semiconductor memory device of this embodiment, even if the bit line is over-charged or insufficiently pre-charged due to improper capability of the pre-charging circuit and the voltage $V_A$ at the node C is too high or too low, since the voltage $V_A$ at the node C is forcedly changed to have the intermediate potential between the OFF-bit and ON-bit potentials, the time required when the voltage $V_A$ reaches the value at the differential operation point is shortened and the reading speed can be improved.

Moreover, operations of the reading circuit in the non-volatile semiconductor device of this embodiment are the same as those of the first embodiment except operations of the equalizing circuit 6 and detailed description of those is therefore omitted.

Next, configurations of the reading timing generating circuit in the non-volatile semiconductor memory device will be described hereinafter by referring to FIG. 5. The timing generating circuit for reading is chiefly composed of an address change detecting signal generating circuit 101 and a pulse generating circuit 102A.

The address change detecting signal generating circuit 101 includes an address change detecting circuit 103 operated to detect a change point of address data contained in an external address inputting signal AO and to produce an address change detecting signal OS. The pulse generating circuit 102A is operated to produce, in response to the address change detecting signal OS and by internal pulse generating circuits (not shown) embedded therein and, the sense amplifier activating signal SAE used to activate the reading circuit, the bit line pre-charging signal ATDP used to activate the pre-charging circuit 3 in early stages when the sense amplifier activating signal SAE remains high, the equalizing signal EQL used to operate the equalizing circuit in late stages when the bit line pre-charging signal ATDP remains high and the sense amplifier output latching signal LAT used to latch an output from the sense circuit 4 at the latch circuit 5.

Next, reading operations in the non-volatile semiconductor memory device of this embodiment will be described by referring to FIG. 6. FIG. 6 shows each of signals for components of the reading circuit in the non-volatile semiconductor memory device of this embodiment. In response to external address inputting signals AO to Ai, an address change detecting signal OS is outputted from the address change detecting signal generating circuit 101, which causes the pulse generating circuit 102A to produce a sense amplifier activating signal SAE* (in the drawing, a symbol "*" represents an inverted signal), a bit line pre-charging signal ATDP*, an equalizing signal EQL and a sense amplifier output latching signal LAT. Additionally, in the reading circuit shown in FIG. 3, the sense amplifier activating signal SAE* and the bit line pre-charging signal TDP* are active while they are not inverted.

The sense amplifier activating signal SAE* causes the P-channel transistors 15 and 16 to be turned ON and the N-channel transistor 13 to be turned OFF in the feedback-type bias circuit 1 and, as a result, the current $I_1$ fed from the load circuit 2 through the N-transistor 11 flows to the bit line. Moreover, in early stages when the sense amplifier activating signal SAE* remains active, the generation of the bit line pre-charging signal ATDP * causes the current $I_2$ to flow from the pre-charging circuit 3A to the bit line. Therefore, a current $I_M$ (=$I_1$+$I_2$) flows through the bit line, thus causing the bit line to be pre-charged.

When the equalizing signal EQL is produced at a last stage of pre-charging operations, a short-circuit between the nodes C and A is established and the voltage $V_A$ approaches a value at the differential operation point. When the feedback operation in the feedback-type bias circuit 1 and pre-charging by the pre-charging circuit 3A are completed, the voltage $V_A$ at the node C to be inputted to the sense circuit 4 is determined as the OFF-bit potential(i.e., OFF potential) or ON-bit potential (i.e., ON potential) in accordance with an OFF or ON state. The latch circuit 5 is operated to produce an output from the sense circuit 4 in response to the sense amplifier output latching signal LAT.

FIGS. 7A and 7B are enlarged diagrams showing changes in voltages and currents at each component of the reading circuit at a time of reading in the non-volatile semiconductor memory device, with changes in voltages and currents shown in 7A and 7B respectively. Changes in voltages and currents shown in 7A and 7B are examples occurring when the pre-charging capability of the pre-charging circuit 3A is not sufficient. As depicted in FIGS. 7A and 7B, since the current $I_2$ from the pre-charging circuit 3A is small, even after the completion of the pre-charging, the voltage $V_A$ at the node C does not reach the differential operation point value at which the current flowing through the N-channel transistor 11 of the feedback-type bias circuit 1 becomes zero. However, by the equalizing signal EQL which is generated at the last stage when the bit line pre-charging signal ATDP is inactive, the equalizing circuit 6 is operated, causing a short-circuit between the nodes C and A to be established and the voltage $V_A$ at the node C to forcedly be equal to the voltage $V_F$ so that the voltage $V_A$ can approach the differential operation point and, as a result, the voltage $V_A$ at the node C is determined as the OFF-bit potential or ON-bit potential.

As described above, in the non-volatile semiconductor memory device of the present invention, since the current based on electrical charges given to the additional capacitor of the pre-charging circuit is interrupted by separation of the pre-charging circuit from the bit line at the time of the completion of pre-charging the bit line, the over-charging caused by the pre-charging current can be prevented, thus enabling early transmission of memory cell currents to the sense circuit at the time of the completion of the pre-charging and speeding-up of reading operations.

Furthermore, in the non-volatile semiconductor memory device of the present invention, by establishing the short-circuit between an outputting side (i.e., the node C) and feedback inputting side (i.e., the node A) of the transistors for controlling the bias in the feedback-type bias circuit at the last stage of pre-charging the bit line and by forcedly causing the voltage at the node C to approach the differential operation point value, the voltage on the outputting side is rapidly determined as the OFF-bit or ON-bit potential, thus enabling the speeding-up of the reading operations.

It is apparent that the present invention is not limited to the above embodiments but may be changed and modified without departing from the scope and spirit of the invention. For example, the equalizing circuit 6 may be used in combination not only with the pre-charging circuit 3A of the first embodiment but also with the pre-charging circuit 3B of the second embodiment. Also, it may be used singly. Moreover, the present invention is not limited to a flash memory and may be applicable to a mask ROM (Read Only Memory) or an EPROM (Erasable Programmable Read Only Memory).

Finally, the present application claims the priority of Japanese Patent Application No. Hei11-118853 filed on Apr. 26, 1999, which is herein incorporated by reference.

What is claimed is:

1. A non-volatile semiconductor memory device comprising:

bias voltage supplying circuit for supplying a predetermined bias voltage to a bit line by letting a current flow from a load circuit, in response to a first timing signal produced when an address of a memory cell is selected, to said memory cell to be connected to said bit line by a bit line selecting circuit in accordance with selection of said address and for generating a reading voltage at a point of connection with said load circuit by letting the current flow in accordance with an ON-state or OFF-state of said memory cell, a pre-charging circuit for letting a current flow to said bit line in response to a second timing signal produced in an early stage when said second timing signal is active; and whereby said pre-charging circuit is operated to interrupt a current in a last stage when said second timing signal is active.

2. The non-volatile semiconductor memory device according to claim 1, wherein said load circuit is composed of a switching circuit to be turned ON in response to said first timing signal which is connected to a constant current source circuit in series.

3. The non-volatile semiconductor memory device according to claim 2, wherein said switching circuit is composed of a P-channel transistor, a source of which is connected to a power source, to a gate of which said first timing signal is supplied and a drain of which is connected to said constant current source circuit and wherein said constant current source is composed of an N-channel transistor, a drain of which is connected to said drain of said P-channel transistor, a gate of which is connected to said drain of said P-channel transistor and a source of which is connected to said bias voltage supplying circuit.

4. The non-volatile semiconductor memory device according to claim 1, wherein said bias voltage supplying circuit is composed of a feedback-type bias circuit having a current controlling circuit operated to let a current flow from a power source through said load circuit to a bit line in response to a control signal and a feedback circuit operated to feed a signal a voltage of which is dropped when a current flows from current supplying circuit in accordance with a bias voltage occurring at said bias line, as said control signal, back to said current controlling circuit.

5. The non-volatile semiconductor memory device according to claim 4, wherein said current controlling circuit is composed of an N-channel transistor, a source of which is connected to said load circuit, to a gate of which said control signal is supplied, and a drain of which is connected to said bit line, and wherein said feedback circuit is composed of an N-channel transistor, a source of which is connected to a ground, to a gate of which said bias voltage is applied and a drain of which is connected to said current supplying circuit and wherein said control signal is outputted from a point of connection between said drain of said N-channel transistor and said current supplying circuit.

6. The non-volatile semiconductor memory device according to claim 4, wherein said current supplying circuit is composed of a first current supplying section which is turned ON in response to said first timing signal and a second current supplying section to which switching circuit to be turned ON in response to said first timing signal and a constant current source circuit are connected in series, said first current supplying section and said second current supplying section being connected, in parallel, between a power source and said feedback circuit.

7. The non-volatile semiconductor memory device according to claim 6, wherein said first current supplying section is composed of a first P-channel transistor, a source of which is connected to a power source, to a gate of which said first timing signal is supplied and a drain of which is connected to said feedback circuit and wherein said second current supplying section is composed of a second P-channel transistor, a source of which is connected to a power source, to a gate of which said first timing signal is supplied and a drain of which is connected to a drain of an N-channel transistor and said N-channel transistor, the drain of which is connected to the drain of said second P-channel transistor, a gate of which is connected to the drain of said N-channel transistor and a source of which is connected to said feedback circuit.

8. The non-volatile semiconductor memory device according to claim 4, further comprising grounding circuit, connected in parallel to said feedback circuit, used to connect a terminal of a control signal output from said feedback circuit to a ground while said first timing signal is inactive.

9. The non-volatile semiconductor memory device according to claim 8, wherein said grounding circuit is composed of an N-channel transistor, a drain of which is connected to a drain of said N-channel transistor constituting said feedback circuit, to a gate of which said first timing signal is supplied and a source of which is connected to a ground.

10. The non-volatile semiconductor memory device according to claim 4, wherein said pre-charging circuit is composed of a first switching circuit which is turned ON in response to said second timing signal, the current controlling circuit used to control a current in response to said control signal connected between a power source and said bit line and a second switching circuit which is turned OFF in response to a reverted signal of said second timing signal connected between said power source and said bit line.

11. The non-volatile semiconductor memory device according to claim 10, wherein said first switching circuit is composed of a P-channel transistor, a source of which is connected to a power source, to a gate of which said second timing signal is supplied and a drain of which is connected to said current controlling circuit and wherein said current controlling section is composed of a first N-channel transistor, a drain of which is connected to the drain of said P-channel transistor, to a gate of which said control signal is supplied and a source of which is connected to said second switching circuit, and wherein said second switching circuit is composed of a second N-channel transistor, a drain of which is connected to the drain of said first N-channel transistor, to a gate of which said second timing signal is supplied through an inverter and a source of which is connected to said bit line.

12. The non-volatile semiconductor memory device according to claim 4, wherein said pre-charging circuit is composed of a current controlling section used to let a current flow from a power source in response to said control signal connected between said power source and said bit line and of switching circuit which is turned OFF in response to said second timing signal connected between said power source and said bit line.

13. The non-volatile semiconductor memory device according to claim 12, wherein said current controlling section is composed of an N-channel transistor, a drain of which is connected to a power source, to a gate of which said control signal is supplied and a source of which is connected to said switching circuit and wherein said switching circuit is composed of a P-channel transistor, a source of which is connected to the source of said N-channel transistor, to a gate of which said second timing signal is supplied and a drain of which is connected to said bit line.

14. The non-volatile semiconductor memory device according to claim 4, further comprising an equalizing circuit used to establish a short-circuit between a point of connection between said load circuit and said current controlling circuit and an input side of said current controlling circuit in a last stage while said second timing signal is active.

15. The non-volatile semiconductor memory device according to claim 14, wherein said equalizing circuit is composed of an N-channel transistor, a drain of which is connected to said drain of said N-channel transistor constituting said current controlling circuit, to a gate of which a third timing signal produced in a last stage while said second timing signal is active is supplied and a source of which is connected to a gate of said N-channel transistor constituting said current controlling circuit.

* * * * *